United States Patent [19]
Tsuchiya et al.

[11] Patent Number: 5,716,534
[45] Date of Patent: Feb. 10, 1998

[54] PLASMA PROCESSING METHOD AND PLASMA ETCHING METHOD

[75] Inventors: Hiroshi Tsuchiya; Yoshio Fukasawa, both of Yamanashi-ken; Shuji Mochizuki, Kofu; Yukio Naito, Kofu; Kosuke Imafuku, Kofu, all of Japan

[73] Assignee: Tokyo Electron Limited, Tokyo, Japan

[21] Appl. No.: 564,621

[22] Filed: Nov. 29, 1995

[30] Foreign Application Priority Data

| Dec. 5, 1994 | [JP] | Japan | 6-330239 |
| Dec. 5, 1994 | [JP] | Japan | 6-330240 |
| Dec. 8, 1994 | [JP] | Japan | 6-331283 |

[51] Int. Cl.$^6$ ............................................. H01L 21/00
[52] U.S. Cl. ............................................. 216/67; 438/710
[58] Field of Search ............... 156/643.1, 626.1, 156/345 P; 216/67, 71; 118/723 R, 723 E; 204/298.08, 298.34

[56] References Cited

U.S. PATENT DOCUMENTS 5,110,437  5/1992  Yamada et al. .
5,314,603  5/1994  Sugiyama et al. .
5,456,796  10/1995  Gupta et al. .
5,542,559  8/1996  Kawakami et al. .

*Primary Examiner*—R. Bruce Breneman
*Assistant Examiner*—Luz Alejandro
*Attorney, Agent, or Firm*—Oblon, Spivak, McClelland, Maier & Neustadt, P.C.

[57] ABSTRACT

A plasma etching apparatus includes a process chamber that can be set at a reduced pressure. A lower electrode on which a semiconductor wafer is placed and an upper electrode opposing the lower electrode are disposed in the process chamber. The lower and upper electrodes are connected to RF power supplies, respectively. First and second RF powers, the phases and power ratio of which are separately controlled, can be applied to the upper and lower electrodes. Parameters including the frequencies, power values, and relative phases of the first and second RF powers are selected in order to set the etching characteristics, e.g., an etching rate, the planar uniformity of the etching rate, the etching selectivity ratio and the like to predetermined values. During etching, the first and second RF powers are monitored by separate detectors, and are maintained at initial preset values through a controller.

12 Claims, 13 Drawing Sheets

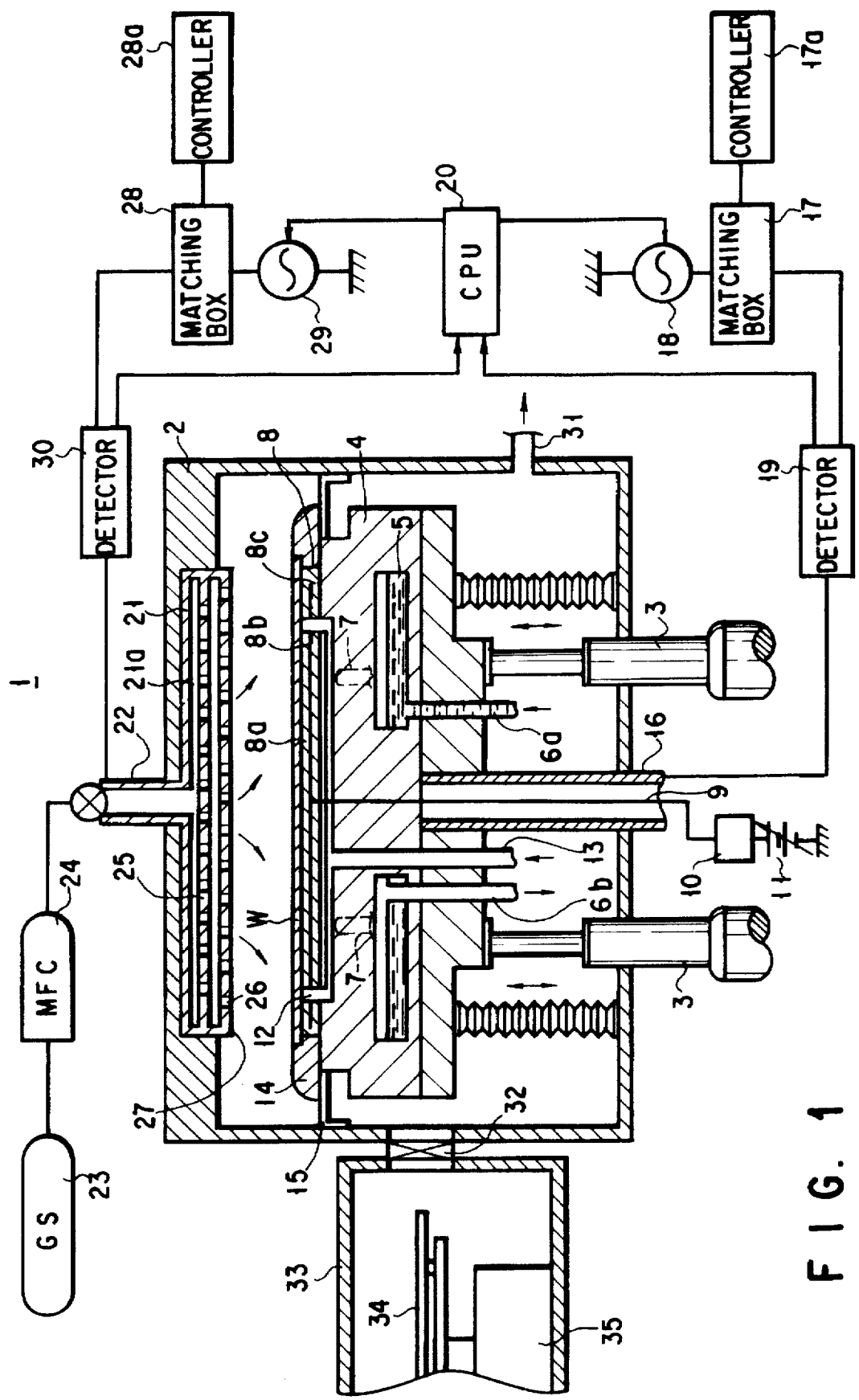
F I G. 1

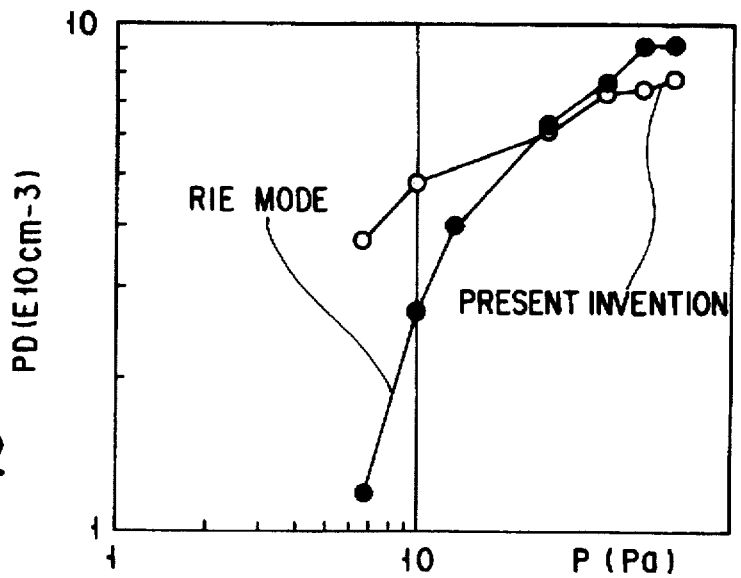
F I G. 2
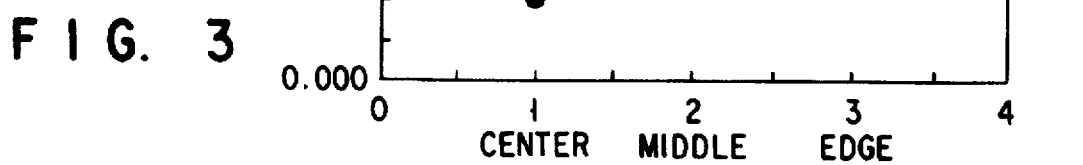
F I G. 3
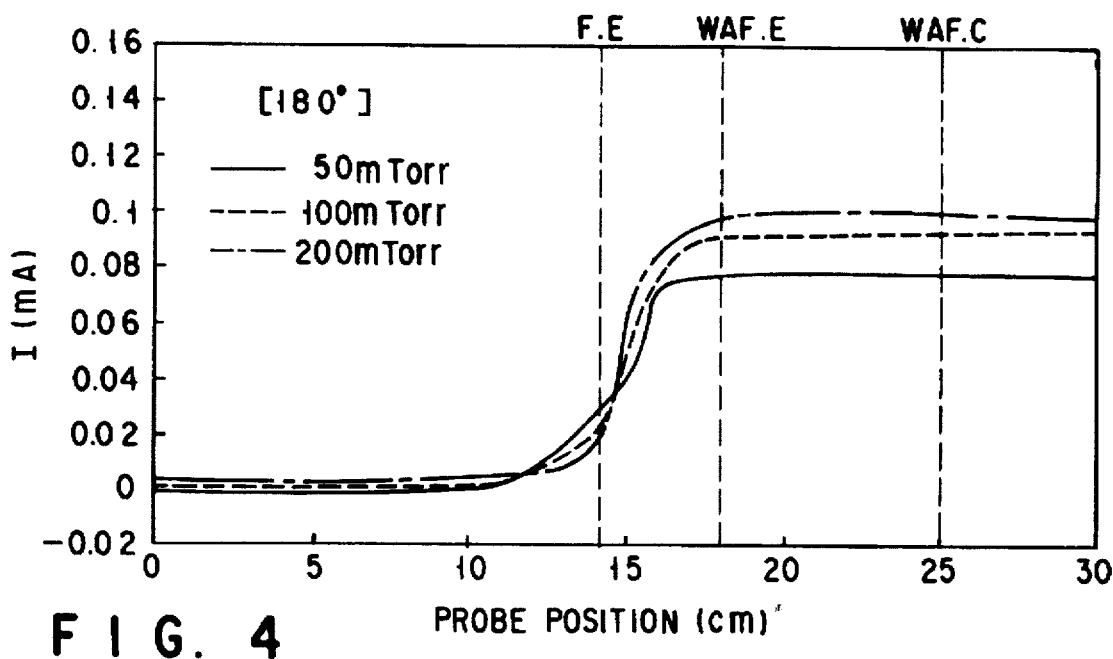
F I G. 4

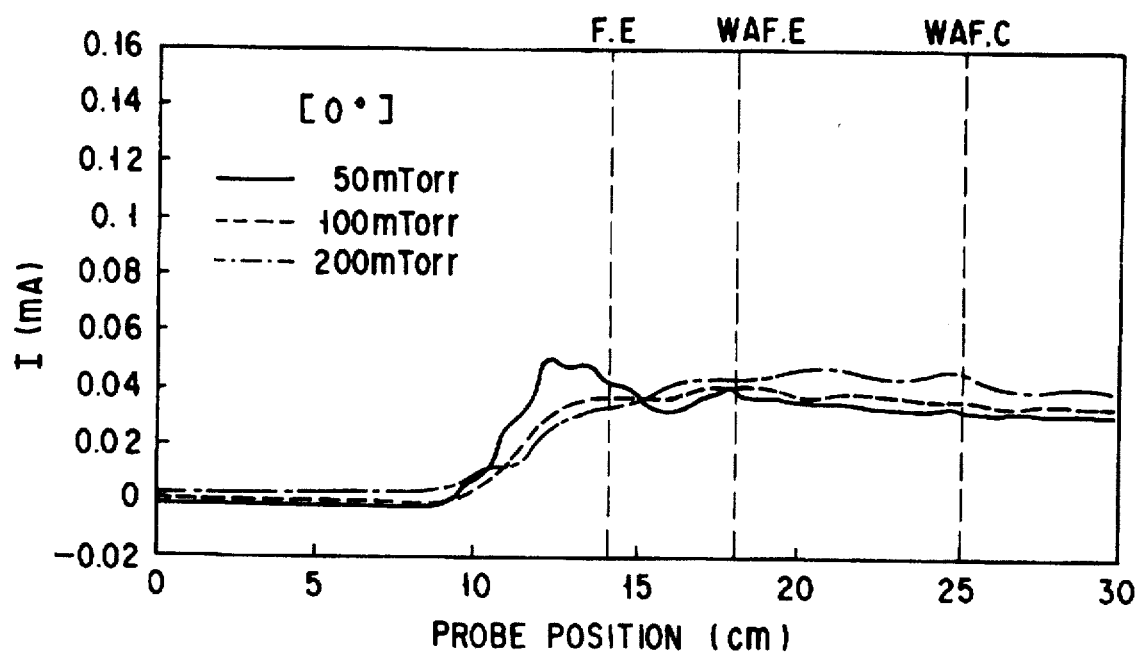
F I G. 5
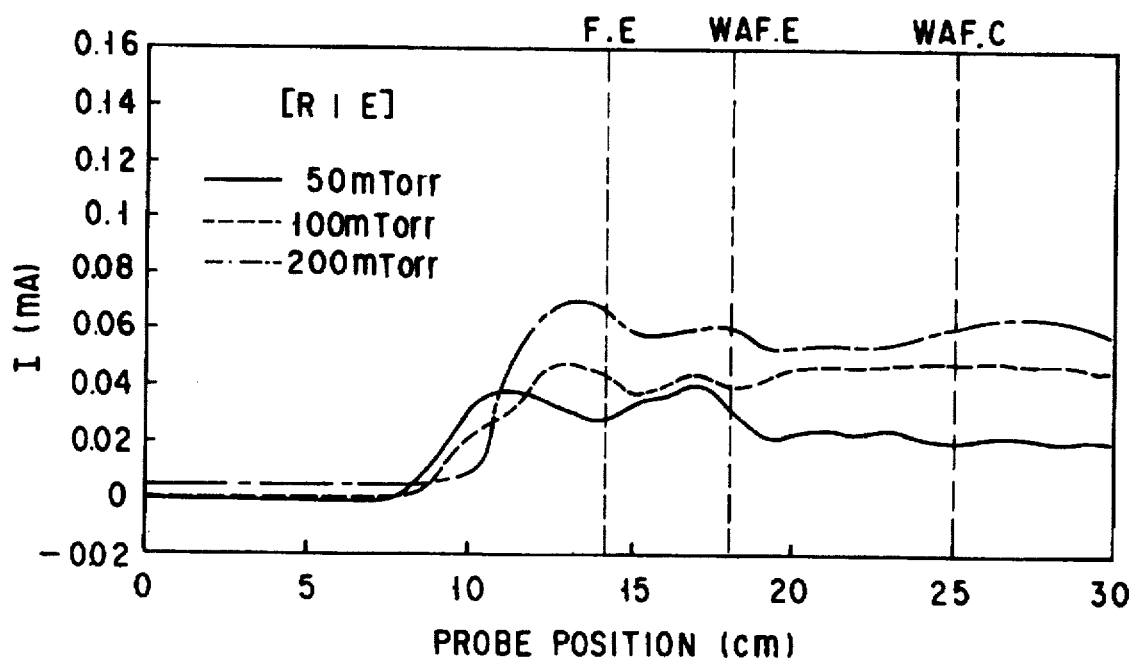
F I G. 6

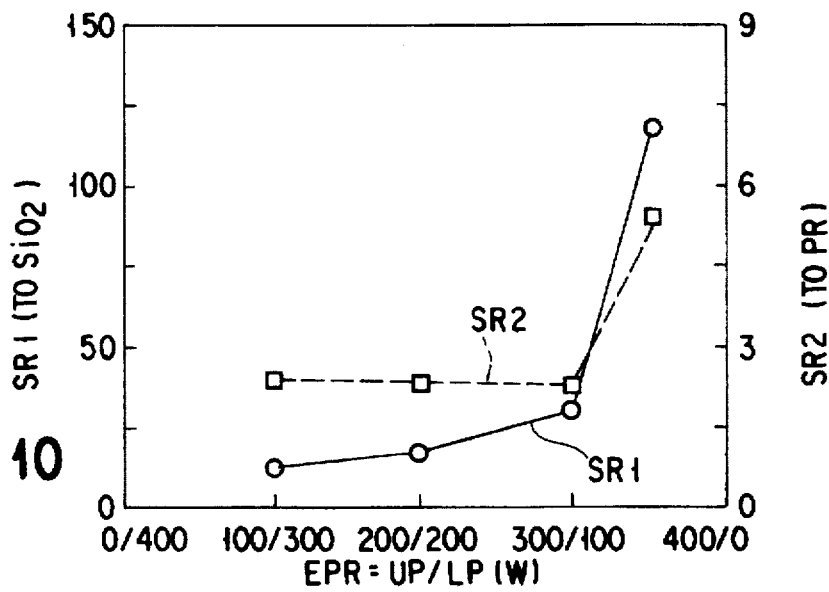
F I G. 10
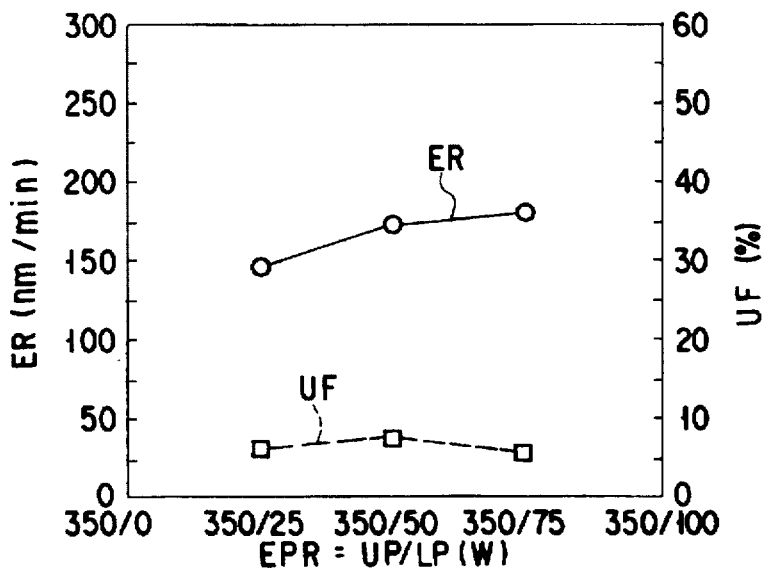
F I G. 11
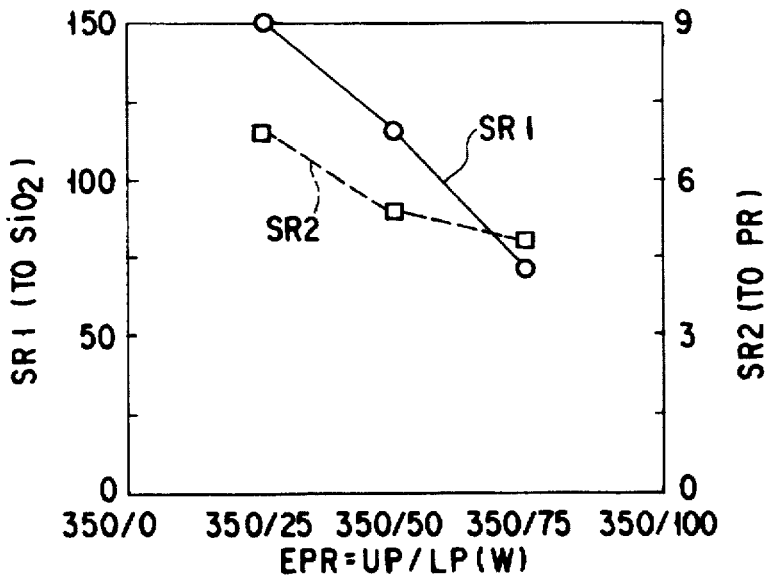
F I G. 12

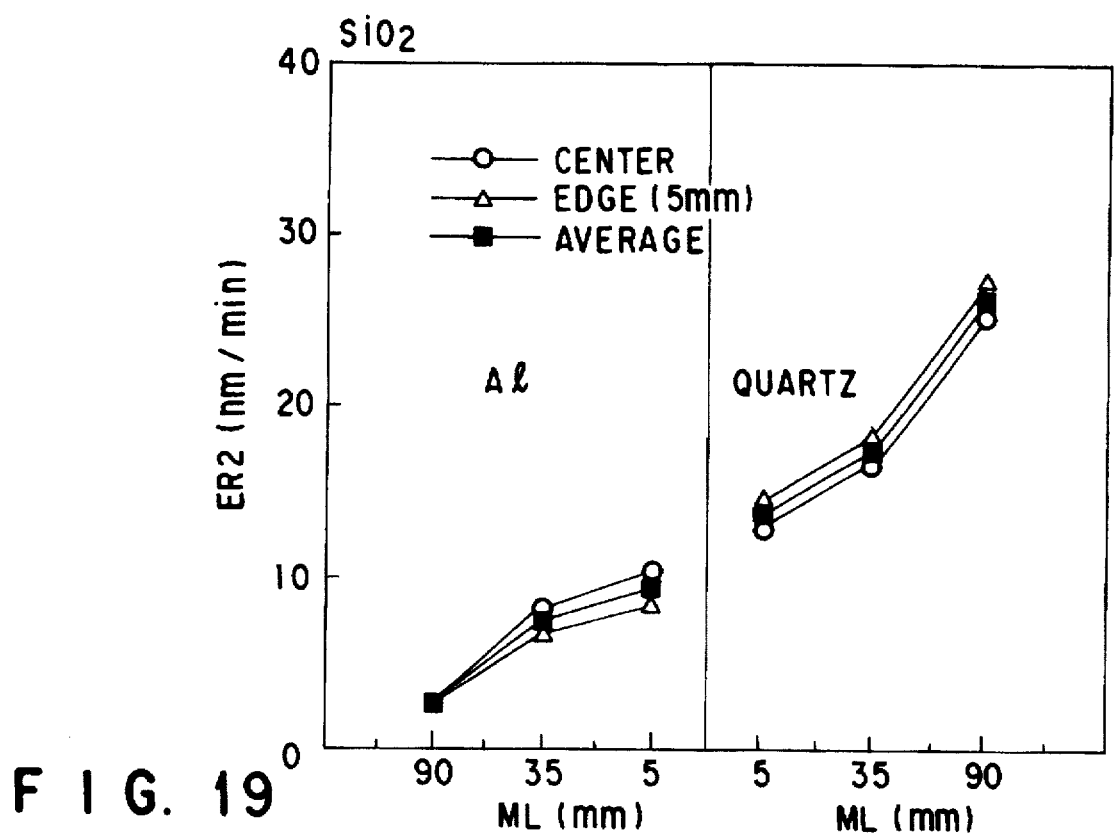
F I G. 19
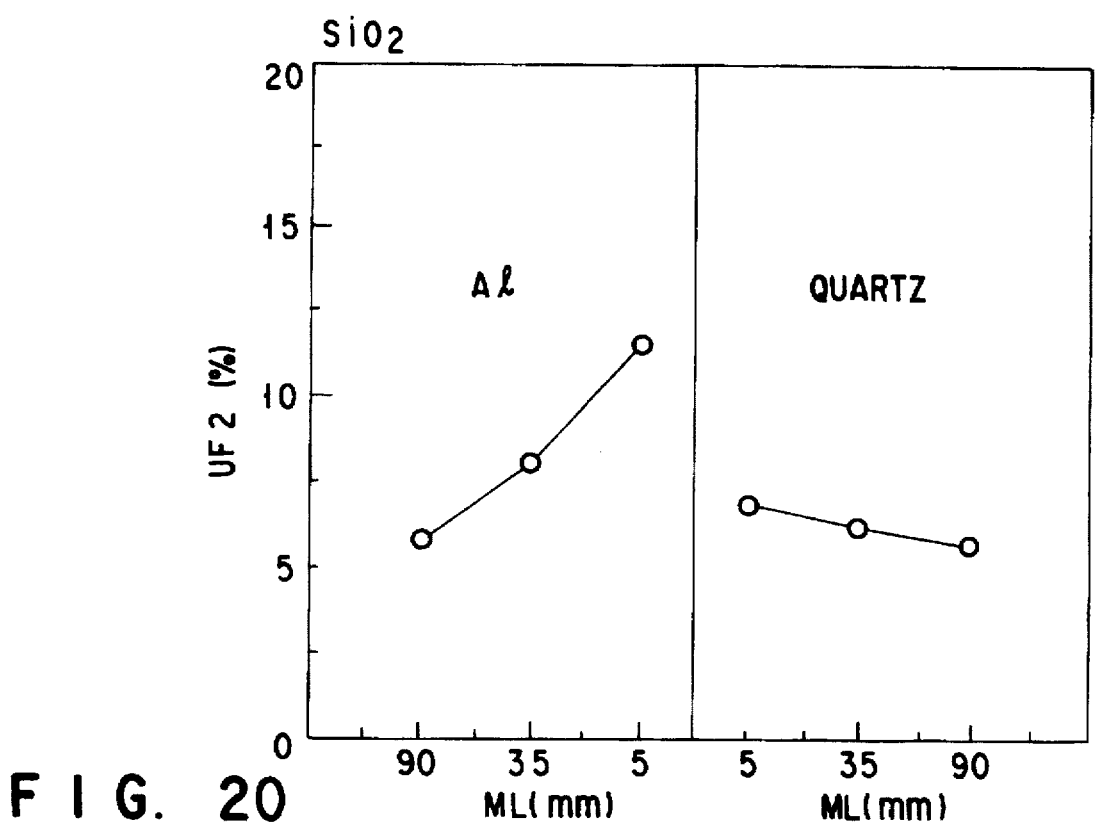
F I G. 20

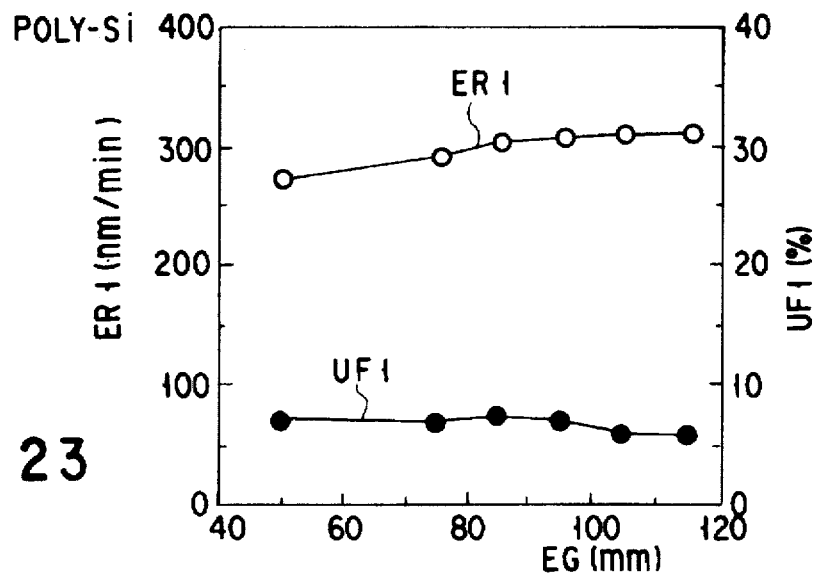
F I G. 23
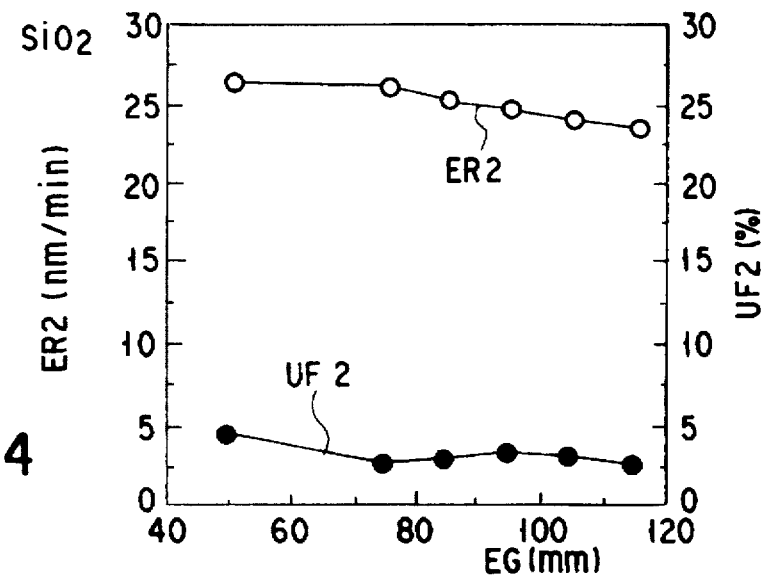
F I G. 24
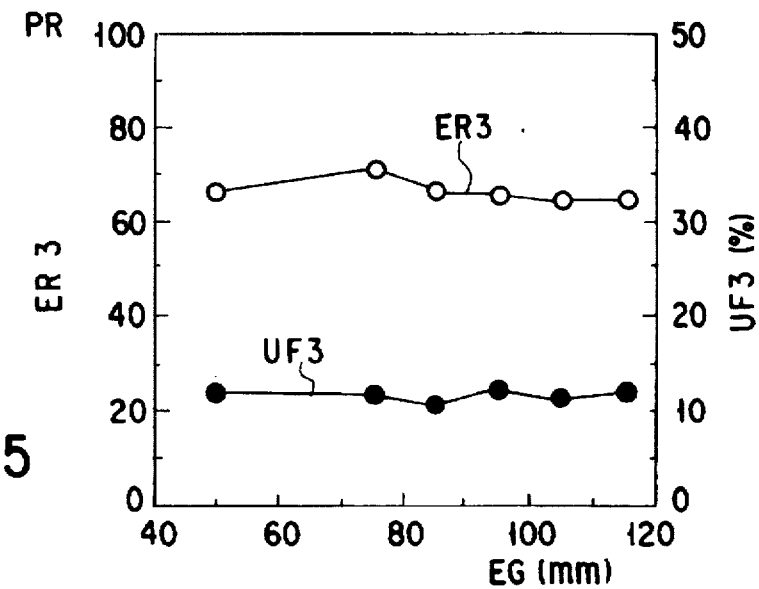
F I G. 25

PLASMA PROCESSING METHOD AND PLASMA ETCHING METHOD

BACKGROUND OF THE INVENTION

1. Field of the Invention

The present invention relates to a plasma processing method and a plasma etching method in a semiconductor process.

2. Description of the Related Art

A plasma etching apparatus is used in a semiconductor process. In the plasma etching apparatus, a reactive gas introduced in the process chamber is converted into a plasma, and the surface of a target object, e.g., a semiconductor wafer, is micropatterned by the plasma.

Plasma etching apparatuses that are generally used are RIE mode etching apparatuses and PE mode etching apparatuses. In an RIE mode etching apparatus, a RF power supply is connected to a lower electrode on which a target object is placed, and an upper electrode is grounded. In a PE mode etching apparatus, a lower electrode on which a target object is placed is grounded, and an upper electrode is connected to an RF power supply.

Along with an increase in integration of a semiconductor device, ultra-microetching on the order of half microns and furthermore quarter microns has become necessary. This ultra-microetching is preferably performed in a process chamber set under low-pressure processing conditions. In the conventional plasma etching apparatus described above, however, under the low-pressure processing conditions of, e.g., 100 mTorr or less, as the mean free path of the particles in the plasma is increased, the electric discharge space is enlarged, leading to a non-uniform, unstable plasma and a decrease in etching rate. Accordingly, in the conventional plasma etching apparatus, a sufficiently high etching rate, the planar uniformity of the etching rate, and the etching selectivity ratio that are required for performing ultra-microprocessing cannot be obtained.

SUMMARY OF THE INVENTION

It is an object of the present invention to provide a plasma processing method capable of reliably controlling the plasma density and suppressing damage to a target object under low-pressure processing conditions.

It is another object of the present invention to provide a plasma etching method capable of realizing ultra-micropatterning with a high etching rate, a high selectivity ratio, and a high planar uniformity under the low-pressure processing conditions of 100 mTorr or less.

In order to achieve these object, the present inventors conducted experiments on the advantages and disadvantages of a plasma etching apparatus in which RF power supplies were respectively connected to the upper and lower electrodes. As a result, the present inventors found a problem in that, with the plasma etching apparatus of this type, variations occurred in the plasma density due to the interference between the RF powers of the upper and lower electrodes and the distortion of the RF waves. The present inventors also found a problem in that, under the low-pressure processing conditions of 100 mTorr or less, the plasma remained non-uniform and unstable, the etching rate was decreased, and the selectivity ratio was decreased due to an increase in ion energy.

The above problems in a plasma processing apparatus, e.g., a plasma etching apparatus, in which RF power supplies are respectively connected to upper and lower electrodes, can be solved with a method according to the present invention.

According to a first aspect of the present invention, there is provided a method of processing a target object in a plasma processing apparatus having a hermetic chamber, a first electrode for supporting the target object in the chamber, a second electrode opposing the first electrode in the chamber, and first and second RF power supplies for independently applying first and second RF powers to the first and second electrodes, the method comprising the steps of:

causing the first electrode to support the target object;
setting the chamber in a reduced-pressure state;
introducing a process gas into the chamber;
starting application of the first and second RF powers to the first and second electrodes, thereby starting conversion of the process gas into a plasma;
continuing application of the first and second RF powers to the first and second electrodes, thereby continuing conversion of the process gas into the plasma, and processing the target object by using the plasma; and
stopping application of the first and second RF powers to the first and second electrodes, thereby ending conversion of the process gas into the plasma, wherein application of the first RF power and application of the second RF power are stopped with a time lag therebetween.

According to a second aspect of the present invention, there is provided a method of etching a target object in a plasma etching apparatus having a hermetic chamber, a first electrode for supporting the target object in the chamber, a second electrode opposing the first electrode in the chamber, and first and second RF power supplies for independently applying first and second RF powers to the first and second electrodes, the method comprising the step of:

selecting parameters including frequencies, power values, and relative phases of the first and second RF powers in order to set at least one etching characteristic, selected from a group consisting of an etching rate, a planar uniformity of the etching rate, and an etching selectivity ratio, to a predetermined value;
setting the plasma etching apparatus in accordance with the selected values of the parameters;
causing the first electrode to support the target object;
setting the chamber in a reduced-pressure state;
introducing an etching gas into the chamber;
starting application of the first and second RF powers to the first and second electrodes, thereby starting conversion of the etching gas into a plasma;
continuing application of the first and second RF powers to the first and second electrodes, thereby continuing conversion of the etching gas into the plasma, and etching the target object by using the plasma; and
stopping application of the first and second RF powers to the first and second electrodes, thereby ending conversion of the etching gas into the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic sectional view showing a plasma etching apparatus according to an embodiment of the present invention;

FIG. 2 is a graph showing the relationship between the plasma density and the pressure in the apparatus shown in FIG. 1 and in an RIE mode apparatus;

FIG. 3 is a graph showing the relationship between positions on a wafer and a dimensional transfer error in the apparatus shown in FIG. 1 and in a PE mode apparatus;

FIG. 4 is a graph showing the relationship between a plasma current and a probe position when the phase difference in RF power between the upper and lower electrodes is 180°;

FIG. 5 is a graph showing the relationship between a plasma current and a probe position when the phase difference in RF power between the upper and lower electrodes is 0°;

FIG. 6 is a graph showing the relationship between a plasma current and a probe position of the RIE mode apparatus;

FIG. 10 is a graph showing the relationship between the power ratio of the RF power of the upper electrode to that of the lower electrode and the etching selectivity ratio;

FIG. 11 is a graph showing the relationship between the power ratio of the RF power of the upper electrode to that of the lower electrode, the etching rate of polysilicon, and the planar uniformity of the etching rate;

FIG. 12 is a graph showing the relationship between the power ratio of the RF power of the upper electrode to that of the lower electrode and the etching selectivity ratio;

FIG. 19 is a graph showing the relationship between the material and outer diameter of the focus ring and the etching rate of $SiO_2$;

FIG. 20 is a graph showing the relationship between the material and outer diameter of the focus ring and the planar uniformity of the etching rate of $SiO_2$;

FIG. 23 is a graph showing the relationship between the gap between the upper and lower electrodes, the etching rate of polysilicon, and the planar uniformity of the etching rate;

FIG. 24 is a graph showing the relationship between the gap between the upper and lower electrodes, the etching rate of $SiO_2$, and the planar uniformity of the etching rate;

FIG. 25 is a graph showing the relationship between the gap between the upper and lower electrodes, the etching rate of the photoresist, and the planar uniformity of the etching rate;

DETAILED DESCRIPTION OF THE PREFERRED EMBODIMENTS

Figure 7:
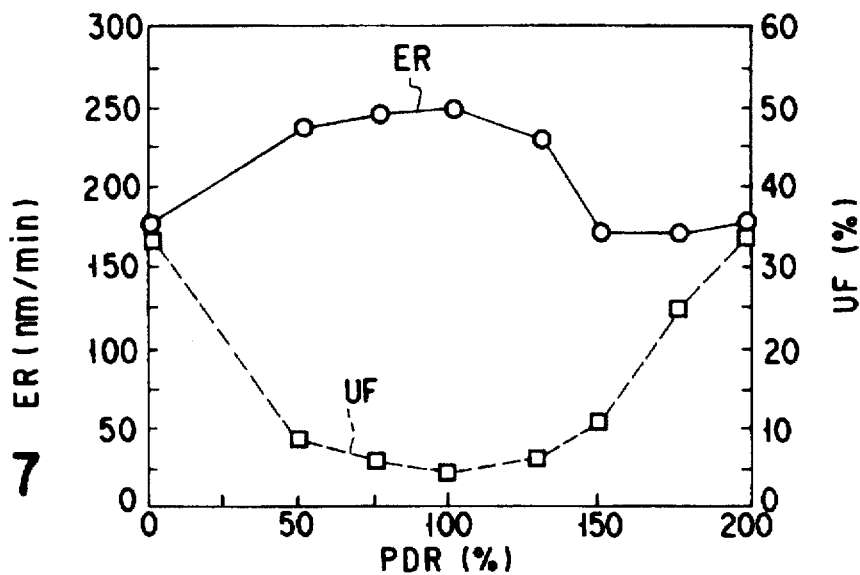
FIG. 7 is a graph showing the relationship between the phase difference ratio of the RF power of the upper electrode to that of the lower electrode, the etching rate of polysilicon (polycrystalline silicon), and the planar uniformity of the etching rate.

A plasma etching apparatus 1 shown in FIG. 1 is formed to etch a semiconductor wafer W. The etching apparatus 1 has a cylindrical or rectangular process chamber 2 made of a conductive material, e.g., aluminum. A substantially cylindrical susceptor (lower electrode) 4, which can be vertically moved by an elevating mechanism 3, e.g., a motor, and which places the wafer W thereon, is accommodated in the process chamber 2. The susceptor 4 is assembled by connecting a plurality of members made of, e.g., aluminum, with bolts or the like.

A plurality of lift pins 7 are disposed to extend through the susceptor 4 vertically. The lift pins 7 are used such that they cooperate with a handling arm 34 of a load-lock chamber 33 (to be described later) to load/unload the wafer W on/from the susceptor 4. The lift pins 7 are driven vertically in a known manner by a driving unit (not shown) disposed outside the process chamber 2.

A cold source such as a coolant circulation line 5 is disposed in the susceptor 4, so that the processing target surface of the wafer W can be adjusted to a predetermined temperature. A coolant which is adjusted to an appropriate temperature by a temperature-adjusting means (not shown) is introduced to the coolant circulation line 5 through an inlet pipe 6a. The introduced coolant circulates in the coolant circulation line 5. During this circulation, the cold is transferred to the wafer W through the susceptor 4, thereby adjusting the target surface of the wafer W to a desired temperature. The coolant after heat exchange is discharged outside the process chamber 2 through a coolant discharge pipe 6b. In place of the arrangement shown in FIG. 1, a cooling jacket and a heater may be disposed in the susceptor 4, and the susceptor 4 may be heated or cooled, thereby temperature-adjusting the wafer W.

The susceptor 4 has a columnar shape in which the central portion of the upper surface forms a projection. An electrostatic chuck 8 for holding the wafer W is disposed on the upper surface of the central portion of the susceptor 4. The electrostatic chuck 8 has a diameter substantially equal to, slightly smaller than, or slightly larger than the diameter of the wafer W. The electrostatic chuck 8 has two films 8a and 8b made of a polymeric insulating material, e.g., a polyimide resin, and a conductive film or layer 8c, e.g., a copper foil, interposed between the films 8a and 8b. The conductive film 8c is connected to a variable DC power supply 11 with a voltage supply lead 9 through an RF cutting filter 10, e.g., a coil. Upon application of a high voltage to the conductive film 8c, the wafer W is chucked and held by the upper surface of the upper film 8a of the electrostatic chuck 8 with a Coulomb force.

In place of the electrostatic chuck 8, a mechanical chuck may be employed which mechanically holds the wafer W with a vertically movable annular clamp member. From the viewpoint of decreasing the damage to the wafer W, the electrostatic chuck 8 is preferably used.

A plurality of heat transfer gas supply holes 12 are concentrically formed in the electrostatic chuck 8. The supply holes 12 are connected to a gas source (not shown) through a gas supply pipe 13. A heat transfer gas, e.g., helium, is supplied from the gas source to a small space defined between the lower surface of the wafer w and the electrostatic chuck 8, so that the heat transfer efficiency from the susceptor 4 to the wafer W is increased.

An annular focus ring 14 is disposed on the peripheral portion of the susceptor 4 so as to surround the circumference of the wafer W on the electrostatic chuck 8 and to place the edge of the wafer W thereon. The focus ring 14 substantially defines a processing space where the wafer (W) is exposed in the rectangular process chamber 2. The focus ring 14 is made of a material that does not attract reactive ions, and operates such that the reactive ions are incident on only the wafer W inside it effectively.

Figure 16:
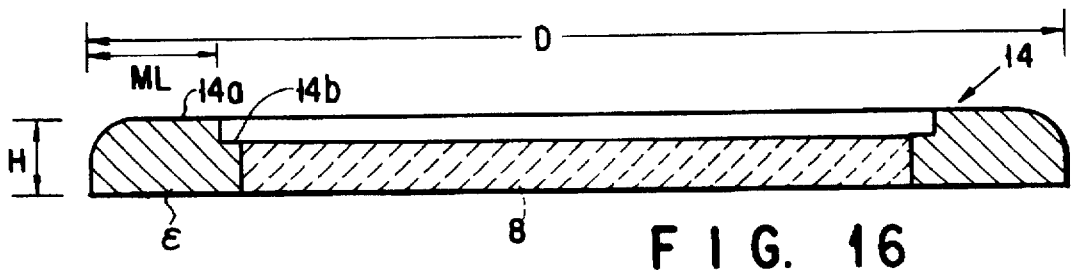
FIG. 16 is an enlarged sectional view of a focus ring.

More specifically, the focus ring 14 is constituted by a ring having an outer diameter D, a width ML, and a thickness H, as shown in FIG. 16. An upper surface 14a of the focus ring 14 is aligned with the target surface of the wafer W which is to be etched. A step 14b is formed on the inner edge of the focus ring 14. The outer edge of the wafer W is placed on the step 14b, so that the wafer W is positioned. As the material of the focus ring 14, an insulating material, e.g., quartz, a conductive material, e.g., carbon, a conductive material coated with an insulating film, e.g., an aluminum member having an anodized surface, or the like can be employed.

An exhaust ring 15 formed with a plurality of baffle holes is disposed between the susceptor 4 and the inner wall of the process chamber 2. The exhaust ring 15 is arranged such that it surrounds the focus ring 14 and that the outer edge of the focus ring 14 is placed on it. The exhaust ring 15 adjusts the flow of the exhaust gas, thereby uniformly exhausting the process gas and the like from the process chamber 2. A power feeding rod 16 made of a hollow conductor is connected to the susceptor 4. The power feeding rod 16 is connected to a RF power supply 18 through a matching box 17 comprising, e.g., a blocking capacitor. The matching box 17 is connected to a controller 17a that sets and displays parameters. During etching, an RF power of, e.g., 13.56 MHz, is applied to the susceptor 4 through the power feeding rod 16.

A detector 19 for monitoring an output from the RF power supply 18 is connected between the matching box 17 and susceptor 4. Information on the output from the RF power supply 18, e.g., the phase and power, which is detected by the detector 19 is fed back to a CPU 20. During etching, the CPU 20 controls the RF power supply 18 based on the information fed back to it as required, so that the output value of the RF power supply 18 becomes close to the initial preset value set in the CPU 20.

An upper electrode 21 is disposed above the susceptor 4 serving as the lower electrode. The gap between the upper and lower electrodes 21 and 4 is set to, e.g., about 5 mm to 150 mm. The gap between the upper and lower electrodes 21 and 4 can be adjusted by vertically moving the susceptor 4 with the elevating mechanism 3.

Similar to the susceptor 4, the upper electrode 21 is connected to an RF power supply 29 through a matching box 28 comprising, e.g., a blocking capacitor. The matching box 28 is connected to a controller 28a that sets and displays parameters. During etching, an RF power of, e.g., 13.56 MHz, is applied to the upper electrode 21.

A detector 30 for monitoring an output from the RF power supply 29 is connected between the matching box 28 and the upper electrode 21. Information on the output from the RF power supply 29, e.g., the phase and power, which is detected by the detector 30 is fed back to the CPU 20. During etching, the CPU 20 controls the RF power supply 29 based on the information fed back to it as required, so that the output value of the RF power supply 29 becomes close to the initial preset value set in the CPU 20.

The upper electrode 21 has a hollow portion 21a, and the hollow portion 21a is connected to a process gas supply pipe 22. The process gas supply pipe 22 is connected to a process gas source 23 through a flow controller (MFC) 24. A predetermined process gas, e.g., an etching gas containing at least one of hydrogen bromide (HBr) and chloride ($Cl_2$) is introduced from the process gas source 23 into the upper electrode 21.

A baffle plate 25 formed with a large number of pores for promoting uniform diffusion of the process gas is disposed at the intermediate portion of the hollow portion 21a. A gas inlet plate 27 formed with a large number of pores 26 for introducing the process gas into the process chamber 2 is disposed below the baffle plate 25. An exhaust port 31 communicating with an exhaust system comprising a vacuum pump and the like is formed in the lower portion of the process chamber 2. The interior of the process chamber 2 can be evacuated to a predetermined pressure, e.g., a reduced pressure atmosphere of 100 mTorr or less, with this exhaust system.

The load-lock chamber 33 is connected to one side surface of the process chamber 2 through a gate valve 32. A convey mechanism 35 having the handling arm 34 is disposed in the load-lock chamber 33. As shown in FIG. 1, the gate valve 32 has an opening portion in the lower portion of the process chamber 2. When loading and unloading the wafer W, the susceptor 4 is moved downward by the elevating mechanism 3. In contrast to this, when etching the wafer W, the susceptor 4 is moved upward by the elevating mechanism 3 until the gap between the upper and lower electrodes 21 and 4 becomes optimum.

The operation of the plasma etching apparatus 1 shown in FIG. 1 will be described.

In the various experiments described below, the standard conditions are as follows. Where the conditions are altered or the conditions are the main part of the experiment, they will be specified clearly.

Wafer size: 6 inches

Etching gas: HBr and $Cl_2$ at mixing ratio of 3:1

Total flow rate of etching gas: 200 sccm

Pressure in process chamber: 100 mTorr

Power to upper electrode: 500 W, 13.56 MHz

Power to lower electrode: 150 W, 13.56 MHz

Phase difference between upper and lower electrodes: 135°

Gap between upper and lower electrodes: 80 mm

Material of focus ring: Al with anodized surface

Width ML of focus ring: 30 mm

FIG. 2 shows the relationship between a plasma density PD and a pressure P when the etching apparatus 1 shown in FIG. 1 and an RIE mode apparatus are used. In the RIE mode apparatus, an RF power supply is connected to only the lower electrode on which a wafer is placed.

In the experiment concerning FIG. 2, a chlorine gas was converted into a plasma. In the apparatus shown in FIG. 1, RF powers, each of which was of 150 W and 13.56 MHz, were applied to both the upper and lower electrodes 21 and 4 with a phase difference of 180°. In the RIE mode apparatus, an RF power of 300 W and 13.56 MHz was applied to the lower electrode, and the upper electrode was grounded. Other conditions were the same between the apparatus 1 shown in FIG. 1 and the RIE mode apparatus.

As shown in FIG. 2, in the RIE mode apparatus, the plasma density PD was sharply decreased under the low-pressure conditions of 100 mTorr (=about 13.3 Pa) or less. It is estimated that problems in the uniformity of the plasma and in the etching rate occur at a low plasma density. In contrast to this, in the apparatus 1 shown in FIG. 1, a plasma density of a certain degree can be maintained even with low-pressure conditions of 100 mTorr (about 13.3 Pa) or less. In other words, with the apparatus shown in FIG. 1, ultra-micropatterning can be executed while maintaining a predetermined level of plasma uniformity and a predetermined level of etching rate.

FIG. 3 shows a dimensional transfer error DTE at different positions (center, middle, edge) of a wafer W when the etching apparatus 1 shown in FIG. 1 and a PE mode apparatus are used. In the PE mode apparatus, an RF power supply is connected to only the upper electrode arranged above the wafer. The dimensional transfer error DTE is a difference between the line width of the upper mask member and the line width of the lower etching target layer after etching.

In the experiment concerning FIG. 3, HBr and $Cl_2$ mixed gas was used as the process gas, and a polysilicon layer was etched by using a photoresist layer as the mask member. In the apparatus shown in FIG. 1, the interior of the process chamber 2 was set at a low pressure of 75 mTorr, and RF powers, each of which was of 150 W and 13.56 MHz, were applied to both the upper and lower electrodes 21 and 4 with a phase difference of 180°. In the PE mode apparatus, the interior of the process chamber was set at a pressure of 600 mTorr. A RF power of 250 W and 13.56 MHz was applied to the upper electrode, and the lower electrode was grounded. Other conditions were the same between the apparatus 1 shown in FIG. 1 and the PE mode apparatus.

As shown in FIG. 3, in the PE mode apparatus, the dimensional transfer error was large and varied largely, whereas in the apparatus shown in FIG. 1, the dimensional transfer error was small and varied little. In other words, with the apparatus 1 shown in FIG. 1, ultra-micropatterning having a high planar uniformity and a low dimensional transfer error can be executed even at a low pressure.

As described above, with the plasma etching apparatus shown in FIG. 1, ultra-micropatterning can be executed even at a low pressure of 100 mTorr or less, at which ultra-micropatterning was difficult to perform with a conventional apparatus.

A control method of optimizing the etching rate, the planar uniformity of the etching rate, and the etching selectivity ratio in the plasma etching apparatus shown in FIG. 1 will be described. According to the present invention, the etching rate, the planar uniformity of the etching rate, and the selectivity ratio can be optimized by appropriately selecting the phase difference, the power ratio, and the gap between the upper and lower electrodes, the mixing ratio of the etching gas, the dielectric constant and size of the focus ring, and the like.

The influences of the processing pressure and the phase difference between the upper and lower electrodes that act on a plasma current I will be described.

FIGS. 4 and 5 show a plasma current I (mA) detected by a probe at different positions on the target surface of a wafer W when the phase difference (phase of upper electrode— phase of lower electrode) of the RF power applied to the upper and lower electrodes 21 and 4 in the apparatus 1 shown in FIG. 1 is set to 180° and 0°, respectively. FIG. 6 shows, as a comparative example, a plasma current I (mA) detected by the probe at different positions on the target surface of a wafer W in the RIE mode apparatus in which the RF power is applied to only the lower electrode. In FIGS. 4 to 6, the symbols "WAF.C", "WAF.E" and "F.E" represent positions at the center of the wafer, at the edge of the wafer and at the edge of the focus ring, respectively.

In the experiments concerning FIGS. 4 to 6, the chlorine gas was converted into a plasma. In the apparatus shown in FIG. 1, RF powers, each of which was of 150 W and 13.56 MHz, were applied to both the upper and lower electrodes 21 and 4. In the RIE mode apparatus, a RF power of 300 W and 13.56 MHz was applied to the lower electrode, and the upper electrode was grounded. Other conditions were the same between the apparatus 1 shown in FIG. 1 and the RIE mode apparatus.

As shown in FIG. 6, in the RIE mode apparatus, the plasma current and accordingly the plasma density varied largely depending on the processing pressure. In particular, in a low-pressure range suitable for ultra-micropatterning, e.g., at a pressure of 100 mTorr or less, the plasma current varied largely depending on the probe position, and the plasma density was decreased as the pressure was decreased. As the plasma extending to a portion around the lower electrode 4 as well, it was influenced easily by the structure (e.g., the structures of the exhaust ring and focus ring) of the process chamber 2, causing a non-uniformity in plasma.

In contrast to this, in the apparatus 1 shown in FIG. 1, when the phase difference between the RF power applied to the upper electrode 21 and that applied to the lower electrode 4 was adjusted appropriately, the characteristics of the plasma current could be controlled in the optimum manner even under the same pressure conditions. For example, when the phase difference was 0° as in FIG. 5, the ion saturation current was uniform at a small value. In contrast to this, when the phase difference was 180° as in FIG. 4, the ion saturation current was uniform at a large value. Where the ion saturation current is uniform, it is possible to obtain a stable plasma and to carry out a uniform etching.

In this manner, in the apparatus 1 shown in FIG. 1, when the phase of the RF power applied to the upper and lower electrodes 21 and 4 is adjusted, a uniform plasma can be generated even under conditions with which a non-uniformity in plasma is caused in the RIE mode apparatus.

The influence of the phase difference between the upper and lower electrodes on etching will be described.

Figure 8:
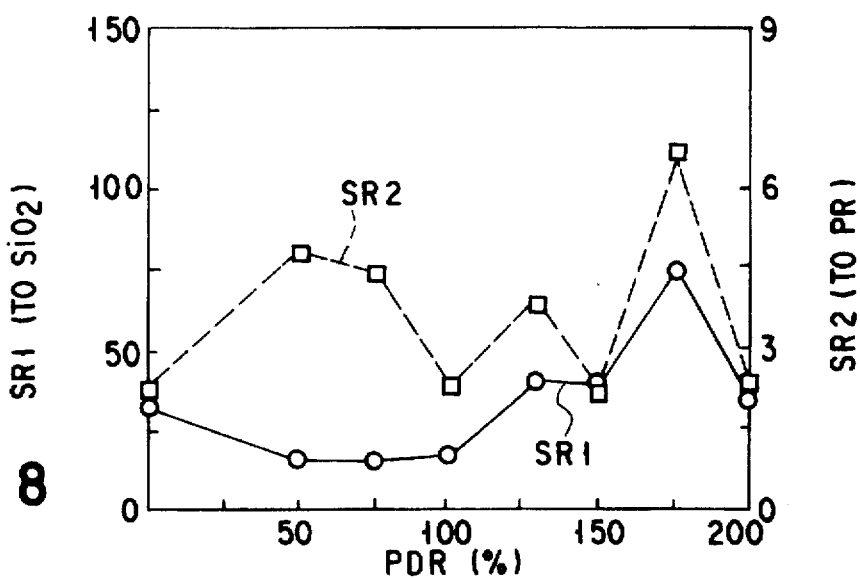
FIG. 8 is a graph showing the relationship between the phase difference ratio of the RF power of the upper electrode to that of the lower electrode and the etching selectivity ratio.

FIGS. 7 and 8 show etching characteristics obtained by changing the phase difference ratio PDR. FIG. 7 shows an etching rate ER of polysilicon and a planar uniformity UF of the etching rate. FIG. 8 shows a selectivity ratio SR1 of polysilicon to a silicon oxide film and a selectivity ratio SR2 of polysilicon to a photoresist PR.

Referring to FIGS. 7 and 8, the phase difference ratio PDR [%] is expressed by an equation, PDR=(PD/180°)×100 (where PD is the phase difference). More specifically, a phase difference of 0° to 360° corresponds to a phase difference ratio of 0% to 200%. The unit of the etching rate is nm/min. The planar uniformity UF is the proportion (%) of the difference between the maximum and minimum values of the etching rate to the average value of the etching rate. The selectivity ratio is the ratio in etching rate of two types of layers.

In the experiments concerning FIGS. 7 and 8, the polysilicon layer was etched by using, as a process gas, a gas mixture containing HBr and Cl$_2$ at a mixing ratio of 1:1. The interior of the process chamber 2 was set at a pressure of 100 mTorr, and RF powers, each of which was of 200 W and 13.56 MHz, were applied to both the upper and lower electrodes 21 and 4.

As shown in FIG. 7, the highest etching rate and a good planar uniformity were obtained when the phase difference ratio was about 100%, i.e., when the phase difference was about 180°. As shown in FIG. 8, the selectivity ratio of polysilicon to the silicon oxide film had a peak when the phase difference ratio was about 175%, i.e., when the phase difference was about 315°. The selectivity ratio of polysilicon to the photoresist PR had peaks at two portions, i.e., when the phase difference ratio was about 50% and about 175%. Namely, the optimum phase difference differs largely depending on the processing target. When FIGS. 7 and 8 are compared, the selectivity ratio is not always maximized with a phase difference with which the maximum etching rate can be obtained.

The influence of the power ratio of the upper and lower electrodes on etching will be described.

Figure 9:
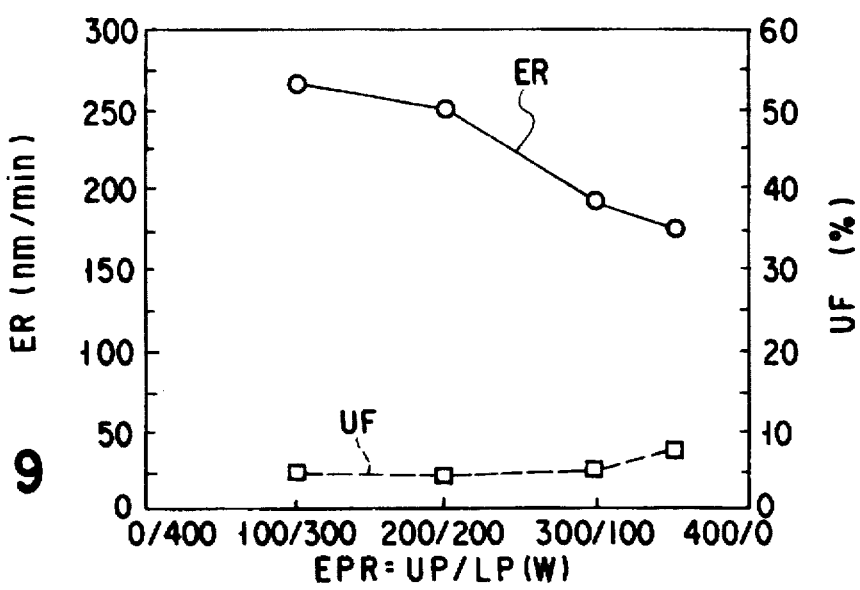
FIG. 9 is a graph showing the relationship between the power ratio of the RF power of the upper electrode to that of the lower electrode, the etching rate of polysilicon, and the planar uniformity of the etching rate.

FIGS. 9 to 12 show etching characteristics obtained by changing a power ratio EPR (upper-electrode power UP)/ (lower-electrode power LP). FIGS. 9 and 11 show the etching rate ER of polysilicon and the planar uniformity UF of the etching rate ER. FIGS. 10 and 12 show the selectivity ratio SR1 of polysilicon to the silicon oxide film and the selectivity ratio SR2 of polysilicon to the photoresist PR.

In the experiments concerning FIGS. 9 and 10, the total power was set to a constant value of 400 W and the power ratio was changed. In the experiments concerning FIGS. 11 and 12, the power of the upper electrode was set to a constant value of 350 W and the power of the lower electrode was changed. In the experiments concerning FIGS. 9 to 12, the polysilicon layer was etched by using, as the process gas, a gas mixture containing HBr and Cl at a mixing ratio of 1:1. The interior of the process chamber 2 was set to a pressure of 100 mTorr, and RF powers, each of which was of 13.56 MHz, were applied to both the upper and lower electrodes 21 and 4 with power values indicated in FIGS. 9 to 12.

In the experiment concerning FIG. 9, the higher the proportion of the power to the lower electrode, the higher the etching rate. The planar uniformity of the etching rate did not change largely in accordance with a change in the power ratio.

In the experiment concerning FIG. 10, the selectivity ratio of polysilicon did not change largely when the power ratio was within a range of 100:300 to 300:100. When, however, the power ratio was larger than 300:100, the selectivity ratio of polysilicon was increased sharply.

In the experiment concerning FIG. 11, the larger the proportion of the power to the upper electrode, the higher the etching rate. The planar uniformity of the etching rate did not change largely in accordance with a change in the power ratio.

In the experiment concerning FIG. 12, the larger the proportion of the power to the upper electrode, the higher the selectivity ratio of polysilicon.

In this manner, with the apparatus 1 shown in FIG. 1, when the power ratio and the phase difference in the upper and lower electrodes are optimized, a high selectivity ratio and a high etching rate can be obtained even at a low pressure of 100 mTorr or less.

The influence of the mixing ratio of Cl$_2$ to HBr on etching will be described.

It is generally known that, when an etching gas not containing carbon is used, although the selectivity ratio of polysilicon is increased, the resist pattern tends to influence etching. Hence, the selectivity ratio and etching rate of polysilicon were examined by using a gas mixture of HBr and Cl$_2$, which is a carbon-free process gas.

Figure 13:
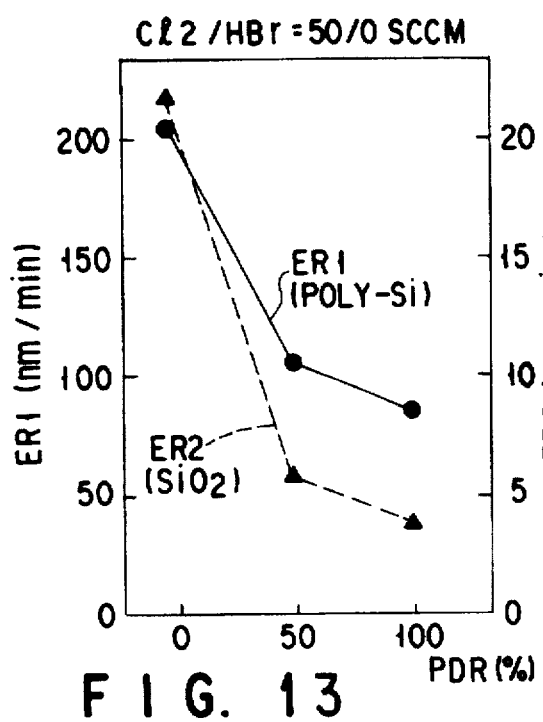
FIG. 13 is a graph showing the relationship between the phase difference ratio of the RF power of the upper electrode to that of the lower electrode, the etching rate of polysilicon, and the etching rate of $SiO_2$ when the flow rate ratio of $Cl_2$/HBr is 50/0 sccm.
Figure 14:
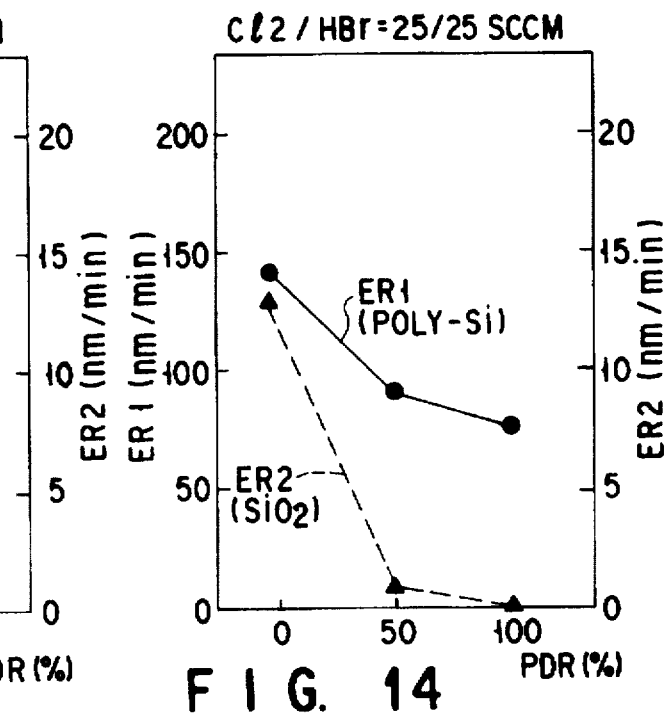
FIG. 14 is a graph showing the relationship between the phase difference ratio of the RF power of the upper electrode to that of the lower electrode, the etching rate of polysilicon, and the etching rate of $SiO_2$ when the flow rate ratio of $Cl_2$/HBr is 25/25 sccm.
Figure 15:
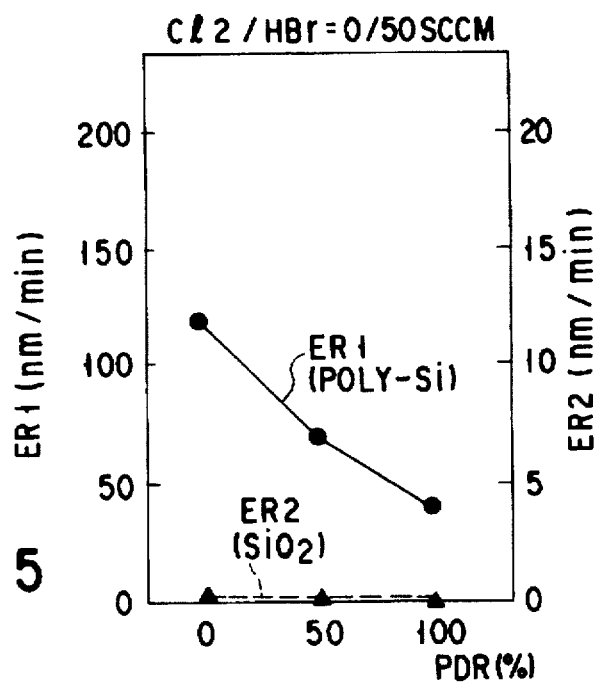
FIG. 15 is a graph showing the relationship between the phase difference ratio of the RF power of the upper electrode to that of the lower electrode, the etching rate of polysilicon, and the etching rate of $SiO_2$ when the flow rate ratio of $Cl_2$/HBr is 0/50 sccm.

FIGS. 13 to 15 show etching characteristics obtained by changing the mixing ratio of the etching gas and the phase difference ratio PDR of the upper and lower electrodes. All of FIGS. 13 to 15 show the etching rate ER1 of polysilicon and the etching rate ER2 of the silicon oxide film. In the experiments concerning FIGS. 13 to 15, the total flow rate of the etching gas was fixed to 50 sccm, and the mixing ratio of the Cl$_2$ to HBr gases was set to 50/0, 25/25, and 0/50, respectively. As shown in FIGS. 13 to 15, the etching rates ER1 and ER2 can be changed by adjusting the mixing ratio of the Cl$_2$ to HBr gases and the phase difference between the upper and lower electrodes.

The influence of the focus ring on etching will be described.

As described above, with the plasma etching apparatus 1 shown in FIG. 1, as the dissociation count of the plasma is increased, a high plasma density can be obtained even at a low pressure. Accordingly, with the etching apparatus 1, ultra-microetching is enabled in units of quarter microns at a low pressure of 100 mTorr or less. In the etching apparatus 1, however, as the plasma tends to concentrate between the upper and lower electrodes, the influence of the focus ring 14 surrounding the wafer W appears conspicuously.

When the plasma is generated, the focus ring 14 serves as capacitance. Capacitance C of the focus ring 14 is expressed by an equation, C=ε(S/H) (where ε, S, and H are respectively the dielectric constant, the upper surface area, and the thickness of the focus ring 14, as shown in FIG. 16).

More specifically, the state of the plasma on the wafer W can be changed by appropriately selecting the material and size of the focus ring 14 and adjusting the dielectric constant ε, the outer diameter D, and the thickness H of the focus ring 14.

Figure 17:
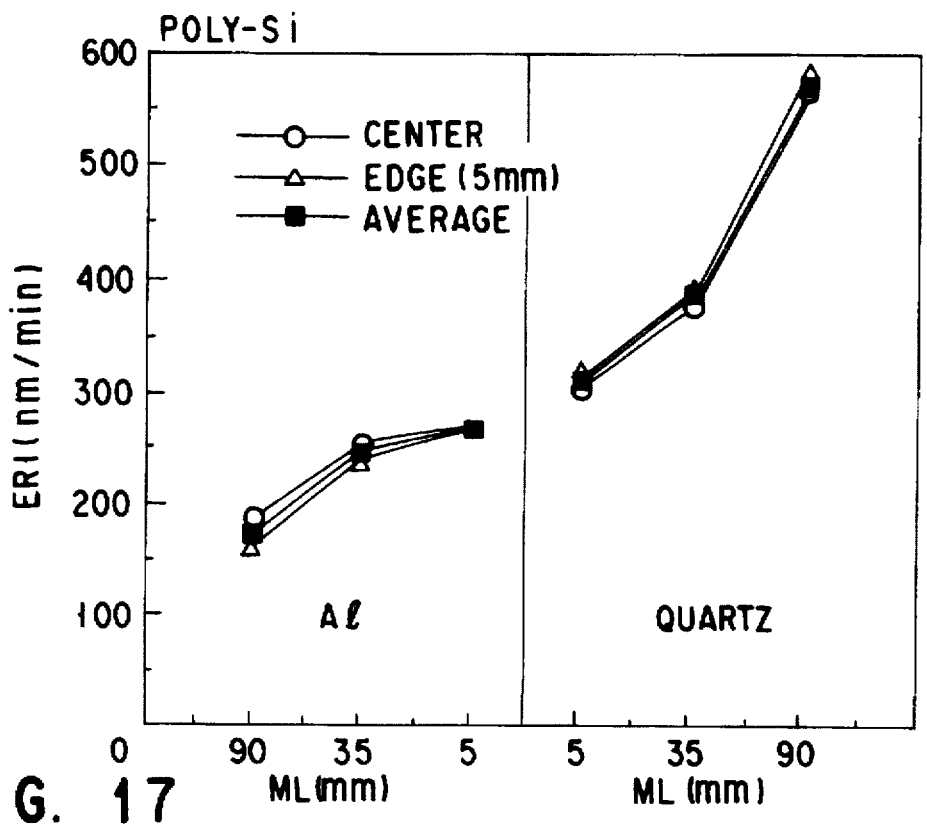
FIG. 17 is a graph showing the relationship between the material and outer diameter of the focus ring and the etching rate of polysilicon.
Figure 18:
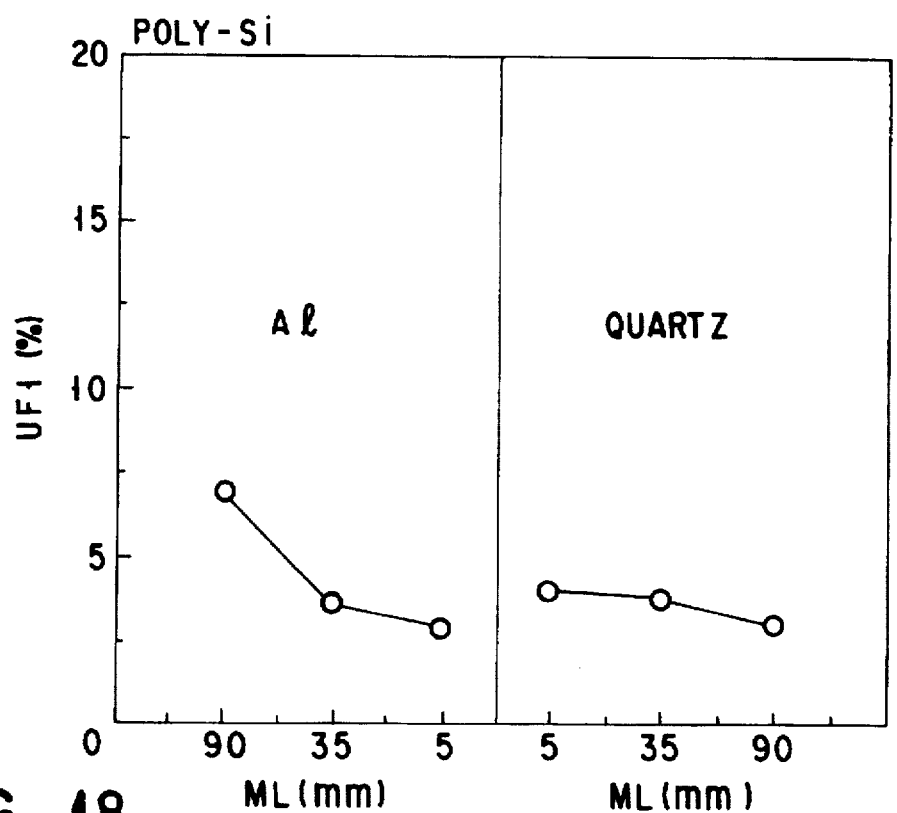
FIG. 18 is a graph showing the relationship between the material and outer diameter of the focus ring and the planar uniformity of the etching rate of polysilicon.
Figure 21:
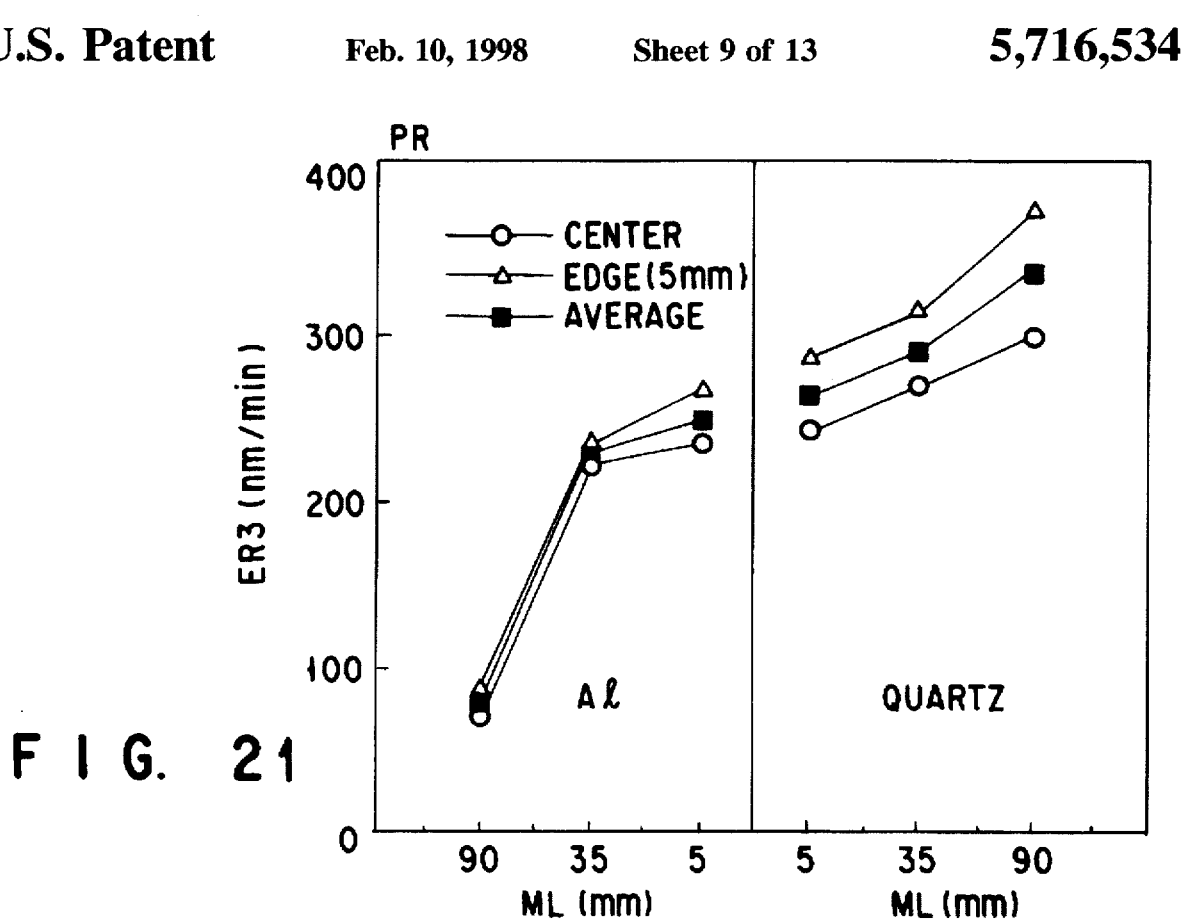
FIG. 21 is a graph showing the relationship between the material and outer diameter of the focus ring and the etching rate of the photoresist.
Figure 22:
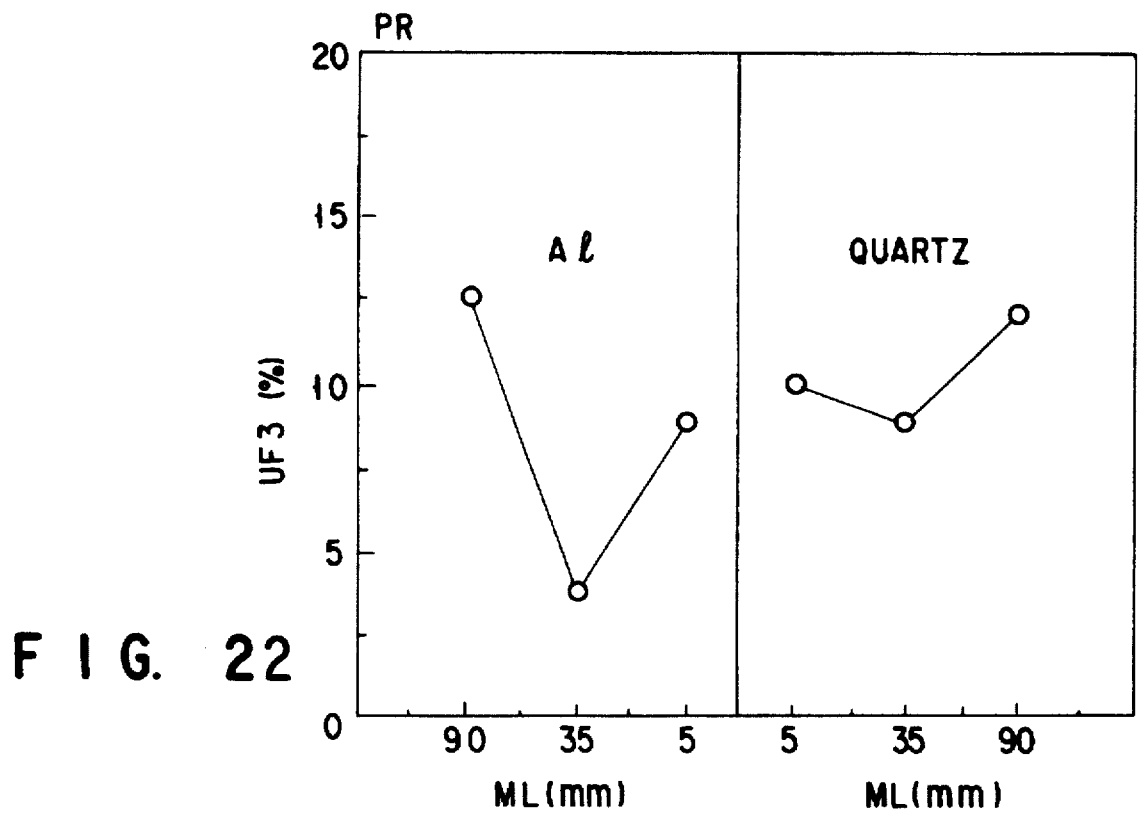
FIG. 22 is a graph showing the relationship between the material and outer diameter of the focus ring and the planar uniformity of the etching rate of the photoresist.

FIGS. 17 to 22 show etching characteristics obtained by changing the material and outer diameter of the focus ring 14. FIGS. 17 and 18 show the etching rate ER1 of polysilicon and the planar uniformity UF1 of the etching rate ER1, respectively. FIGS. 19 and 20 show the etching rate ER2 of $SiO_2$ and the planar uniformity UF2 of the etching rate ER2, respectively. FIGS. 21 and 22 show the etching rate ER3 of the photoresist PR and the planar uniformity UF3 of the etching rate ER3, respectively.

In the experiments concerning FIGS. 17 to 22, aluminum focus rings 14 each having an anodized surface, and quartz focus rings 14 were employed. Regarding the outer diameters D of the focus rings 14, the widths ML (see FIG. 16) of the focus rings 14 were set to 5 mm, 35 mm, and 90 mm with respect to a 6-inch wafer W.

As shown in FIGS. 17 to 22, the etching rate and the planar uniformity of the etching rate differ depending on the processing target (polysilicon, $SiO_2$). Accordingly, when the material and outer diameter of the focus ring 14 are appropriately selected in accordance with the processing target, the etching rate and the planar uniformity can be optimized. Hence, etching can be performed with a high selectivity ratio and a high planar uniformity even at a low pressure of 100 mTorr or less.

Generally, when the focus ring 14 is made of an insulator, the larger the outer diameter of the focus ring 14, the higher the etching rate. Accordingly, if a high etching rate is required, the outer diameter of the focus ring 14 is increased. In contrast to this, if damage-free moderate processing is required, the outer diameter of the focus ring 14 is decreased.

Regarding the material of the focus ring 14, generally, a higher etching rate can be obtained with a focus ring 14 made of an insulator rather than with a focus ring 14 made of a conductor. Accordingly, if a high etching rate is required, a focus ring 14 made of an insulator is used. In contrast to this, if damage-free moderate processing is required, a focus ring 14 made of a conductor is used.

The influence of the gap between the upper and lower electrodes on etching will be described.

Figure 26:
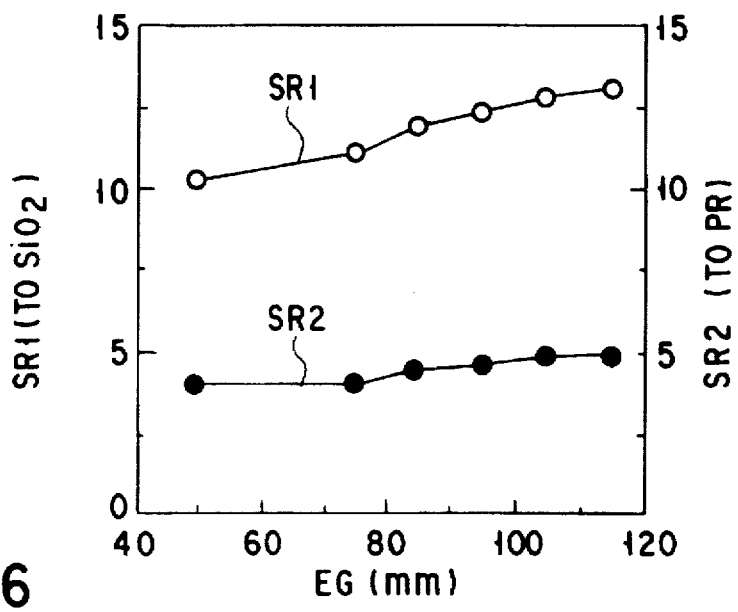
FIG. 26 is a graph showing the relationship between the gap between the upper and lower electrodes and the etching selectivity ratio.

FIGS. 23 to 26 show etching characteristics obtained by changing a gap EG between the upper and lower electrodes 21 and 4. FIG. 23 shows the etching rate ER1 of polysilicon and the planar uniformity UF1 of the etching rate ER1. FIG. 24 shows the etching rate ER2 of $SiO_2$ and the planar uniformity UF2 of the etching rate ER2. FIG. 25 shows the etching rate ER3 of the photoresist PR and the planar uniformity UF3 of the etching rate ER3. FIG. 26 shows the selectivity ratio SR1 of polysilicon to the silicon oxide film and the selectivity ratio SR2 of polysilicon to the photoresist PR.

As shown in FIGS. 23 to 25, where polysilicon was the etching target, the larger the electrode gap EG, the higher the etching rate. Where a silicon oxide film was the etching target, the smaller the electrode gap EG, the higher the etching rate. Where a photo-resist was the etching target (FIG. 25), the highest etching rate was obtained when the electrode gap was set to about 75 mm. In this manner, the electrode gap with which the optimum etching rate can be obtained varies depending on the target objects. According to the present invention, as the electrode gap can be adjusted in accordance with the target object, a process can always be performed at a high etching rate regardless of the type of the target object. As shown in FIG. 26, regarding the selectivity ratio of polysilicon, the larger the electrode gap EG, the higher the selectivity ratio to both a silicon oxide film and a photoresist.

The operation of the plasma etching apparatus 1 shown in FIG. 1 will be described.

The parameters of the plasma etching apparatus 1 are determined in accordance with the etching rate, the planar uniformity of the etching rate, and the selectivity ratio that are required in etching to be performed. The parameters that are set here are the phase difference between the upper and lower electrodes, the power ratio of the upper and lower electrodes, the gap between the upper and lower electrodes, the mixing ratio of the etching gas, the material and size of the focus ring, and the like.

Figure 27:
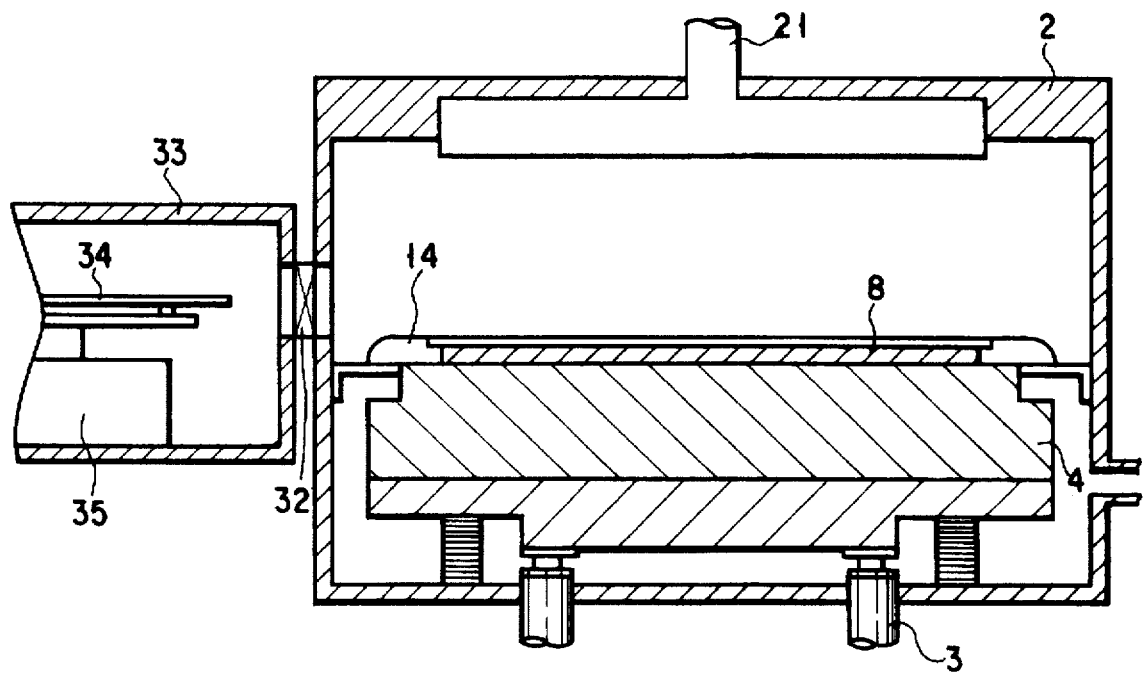
FIGS. 27 to 29 are views showing loading/unloading of the wafer and the movement of the susceptor.

When loading the wafer W as the processing target on the susceptor 4, the susceptor 4 is moved downward to a lower position, as shown in FIG. 27. At this time, the space defined by the upper surfaces of the susceptor 4 and exhaust ring 15 in the process chamber 2 includes the opening of the gate valve 32.

Figure 28:
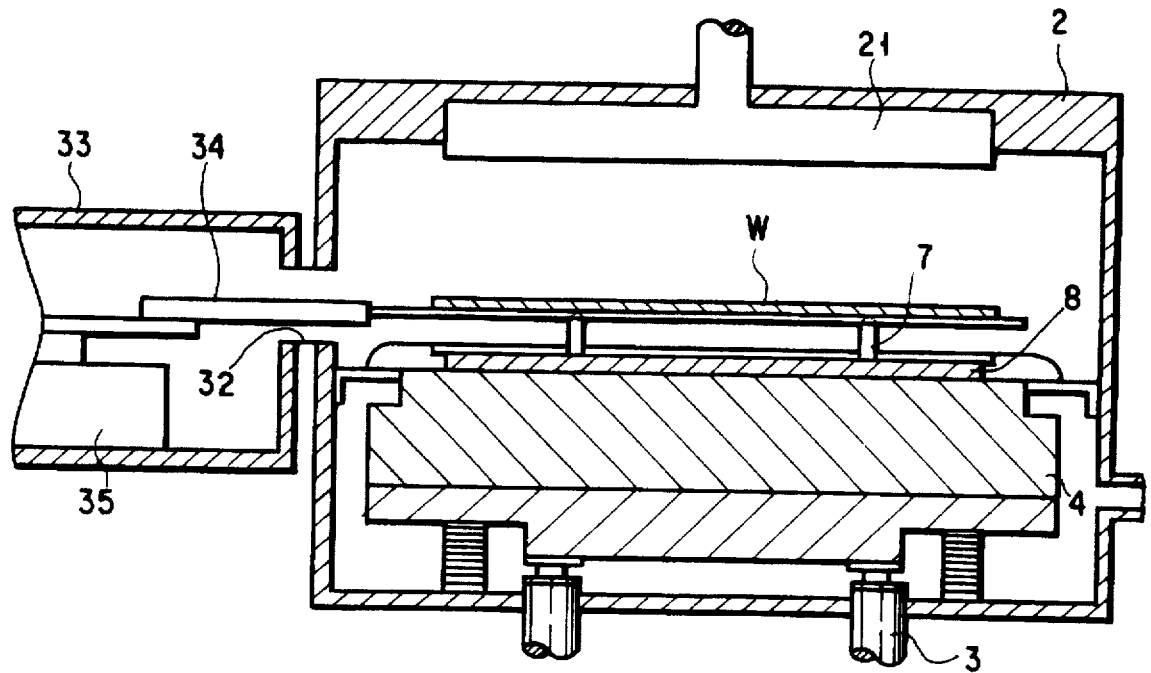

As shown in FIG. 28, the wafer W is loaded from the load-lock chamber 33 into the process chamber 2 by the handling arm 34 through the gate valve 32. The lift pins 7 of the susceptor 4 are moved upward, and the wafer W is transferred from the handling arm 34 onto the lift pins 7. After the handling arm 34 is retreated into the load-lock chamber 33, the lift pins 7 are moved downward, so that the wafer W is placed on the electrostatic chuck 8 and the focus ring 14. A high voltage is applied from the DC power supply 11 to the conductive layer 8c of the electrostatic chuck 8, and the wafer W is chucked and held by the electrostatic chuck 8 with the Coulomb force.

Figure 29:
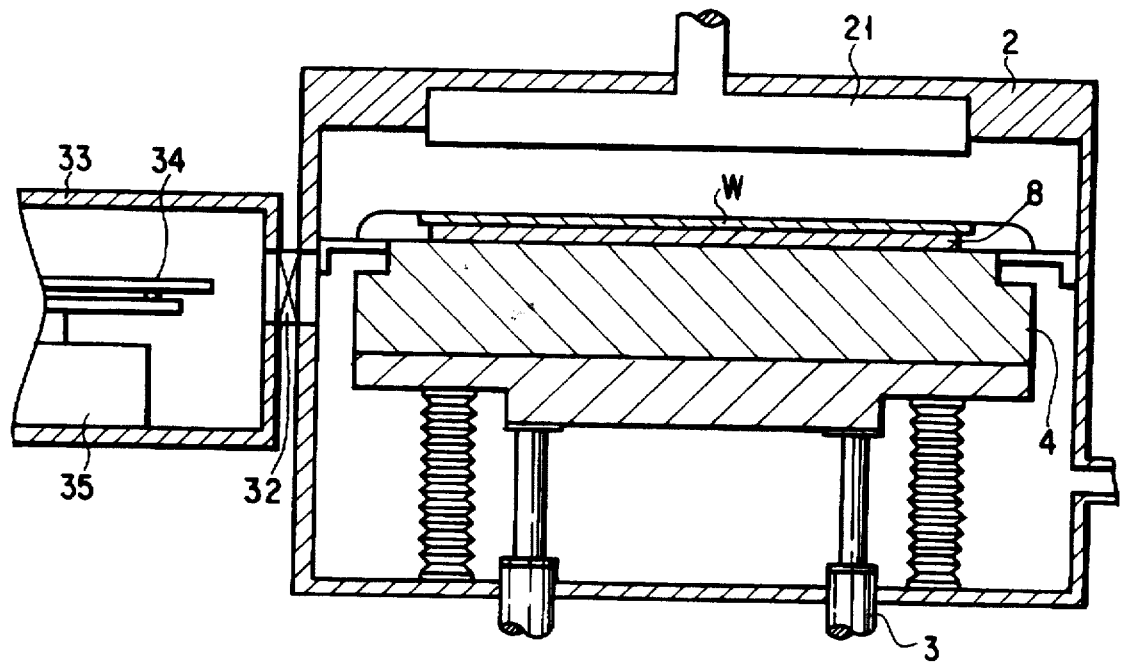

As shown in FIG. 29, the susceptor 4 is moved upward to an upper position. At this time, the space defined by the upper surfaces of the susceptor 4 and exhaust ring 15 in the process chamber 2 does not include the opening of the gate valve 32. In this state, a recessed portion formed by the opening of the gate valve 32 does not exist in the processing space where the wafer W is etched. In other words, the side wall of the space, where a plasma is generated, becomes uniform in its conditions, thereby uniforming the plasma density.

Figure 30:
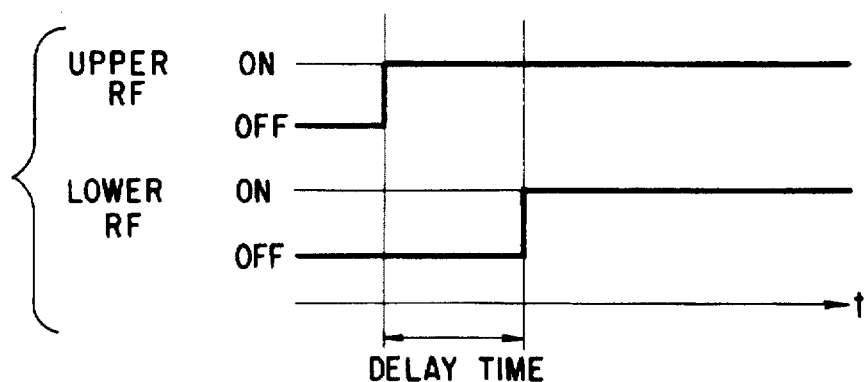
FIG. 30 is a timing chart showing the timings at which the RF power is applied to the upper and lower electrodes at the start of plasma generation.

The interior of the process chamber 2 is reduced to a predetermined pressure, e.g., 100 mTorr, and a gas mixture of, e.g., HBr and $Cl_2$ gases, is introduced from the gas source 23 into the process chamber 2 through the upper electrode 21. Plasma generation is started in accordance with the timing chart shown in FIG. 30. A RF power of, e.g., 500 W and 13.5 MHz, is applied to the upper electrode 21, thus igniting the plasma. Then, with a delay time, e.g., 0.5 second, a RF power of, e.g., 150 W and 13.56 MHz is applied to the lower electrode 4. In this way, matching of the RF powers between the upper and lower electrodes 21 and 4 can be obtained faster and more stably than a case wherein the RF powers are applied to the upper and lower electrodes 21 and 4 simultaneously.

By employing the plasma generated in this manner, the layer on the wafer W, e.g., the polysilicon layer, is etched. During etching, the RF powers applied to the upper and lower electrodes 21 and 4 are monitored by the detectors 30 and 19, respectively, and information on the RF powers is fed back to the CPU 20. Based on this information, the CPU 20 controls the RF power supplies 29 and 18 such that they maintain their initial preset values.

Figure 31:
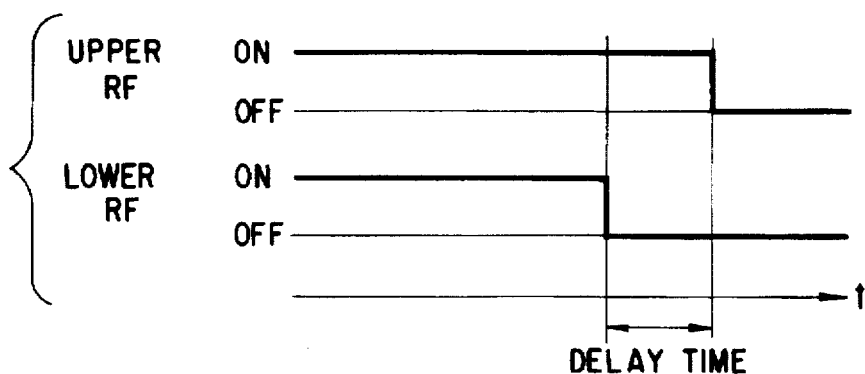
FIG. 31 is a timing chart showing the timings at which the RF power to the upper and lower electrodes is cut at the end of plasma generation.

After predetermined etching is performed, plasma generation is ended in accordance with the timing chart shown in FIG. 31. More specifically, the RF power to the lower electrode 4 is cut off first, and after a lapse of 5 to 10 seconds, the RF power to the upper electrode 21 is cut off. In this way, the dissociation count of the plasma is decreased stepwise, so that charge-up damage to the wafer W can be minimized. When the RF power to the lower electrode 4 is cut off first, the charges accumulated on the wafer W can be removed.

Supply of the etching gas is stopped, the interior of the process chamber 2 is purged, and the susceptor 4 is moved downward to the lower position again, as shown in FIG. 27. The processed wafer W is unloaded from the process chamber 2 by the cooperation of the lift pins 7 of the susceptor 4 and the handling arm 34 of the load-lock chamber 33, as shown in FIG. 28.

Figure 32:
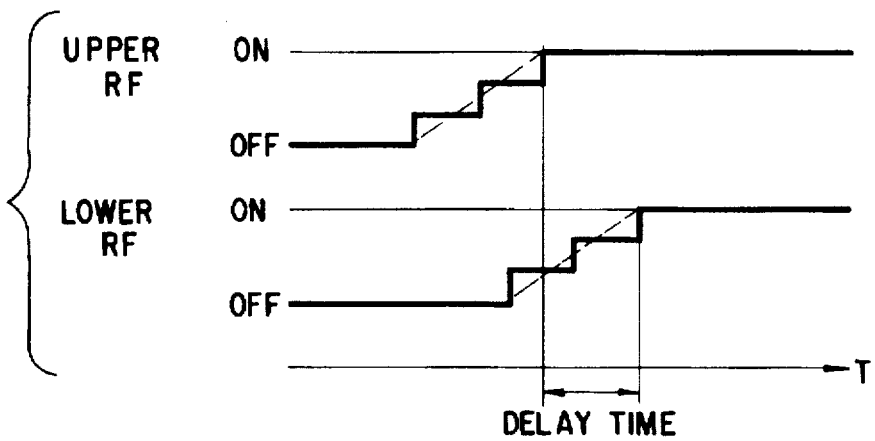
FIG. 32 is a chart showing a modification of the timing chart shown in FIG. 30.
Figure 33:
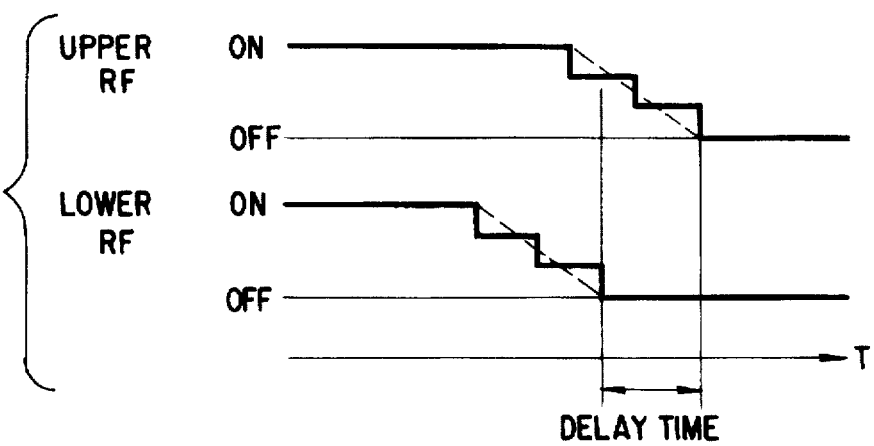
FIG. 33 is a chart showing a modification of the timing chart shown in FIG. 31.

Upon the start and stop of plasma generation, the RF powers can be adjusted stepwise, i.e., by step-up and step-down manner, as indicated by solid lines in FIGS. 32 and 33. The RF powers can also be adjusted in the slow-up and slow-down manner, as indicated by broken lines in FIGS. 32 and 33.

In the above embodiment, optimization of the etching rate, the planar uniformity of the etching rate, and the etching selectivity ratio have been described. The taper angle of the side wall of an etched hole, the anisotropy of etching, and the like can be optimized by adjusting parameters similar to those in this embodiment.

The etching target is not limited to polysilicon. The present invention can similarly be applied to an etching target made of silicon oxide, photoresist, or Si compound such as tungsten silicide, molybdenum silicide, or titanium silicide, and to an etching target made of refractory metal.

Furthermore, the present invention is not limited to a plasma etching apparatus, but can be applied to an apparatus that converts a process gas into a plasma by applying RF powers to both the upper and lower electrodes, e.g., a plasma CVD apparatus and a plasma ashing apparatus.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of processing a target object in a plasma processing apparatus having a hermetic chamber, a first electrode for supporting the target object in said chamber, a second electrode opposing said first electrode in said chamber, and first and second RF power supplies for independently applying first and second RF powers to said first and second electrodes, said method comprising the steps of:

causing said first electrode to support the target object;

setting said chamber in a reduced-pressure state;

introducing a process gas into said chamber;

starting application of the first and second RF powers to said first and second electrodes, thereby starting conversion of the process gas into a plasma;

continuing application of the first and second RF powers to said first and second electrodes, thereby continuing conversion of the process gas into the plasma, and processing the target object by using the plasma; and stopping application of the first and second RF powers to said first and second electrodes, thereby ending conversion of the process gas into the plasma, wherein application of the first RF power and application of the second RF power are stopped with a time lag therebetween.

2. A method according to claim 1, wherein the first and second RF powers are decreased stepwise so that application of the first RF power and application of the second RF power are stopped with the time lag therebetween.

3. A method according to claim 1, wherein application of the first RF power and application of the second RF power are started with a time lag therebetween.

4. A method according to claim 3, wherein the first and second RF powers are increased stepwise so that application of the first RF power and application of the second RF power are started with the time lag therebetween.

5. A method according to claim 1, wherein during conversion of the process gas into the plasma, the first and second RF powers are applied at the same frequency but in different phases.

6. A method according to claim 1, wherein during conversion of the process gas into the plasma, the first and second RF powers are applied at the same frequency but different powers.

7. A method according to claim 1, wherein during conversion of the process gas into the plasma, the first and second RF powers are monitored by separate detectors and are maintained at initial preset values through control means.

8. A method according to claim 1, wherein said apparatus comprises a closable opening portion which is formed in said chamber in order to pass the target object therethrough, means for vertically driving said first electrode, and a partition member mounted to said first electrode to substantially define a processing space where the target object is exposed to the plasma in said chamber, and the target object is loaded and unloaded on and from said first electrode when said first electrode is located at a lower position and said opening portion is included in said processing space, and the process gas is converted into the plasma when said first electrode is located at an upper position and said opening portion is excluded from said processing space.

9. A method of etching a target object in a plasma etching apparatus having a hermetic chamber, a first electrode for supporting the target object in said chamber, a second electrode opposing said first electrode in said chamber, and first and second RF power supplies for independently applying first and second RF power to said first and second electrodes, said method comprising the steps of:

selecting parameters including frequencies, power values, and relative phases of the first and second RF power supplies in order to set at least one etching characteristic, selected from a group consisting of an etching rate, a planar uniformity of the etching rate, and an etching selectivity ratio, to a predetermined value;

setting said plasma etching apparatus in accordance with the selected parameters;

causing said first electrode to support the target object;

setting said chamber in a reduced-pressure state;

introducing an etching gas into said chamber;

starting application of power from the first and second RF power supplies to said first and second electrodes, thereby starting conversion of the etching gas into a plasma;

continuing application of the power from the first and second RF power supplies to said first and second electrodes, thereby continuing conversion of the etching gas into the plasma;

etching the target object by using the plasma; and stopping application of power from the first and second RF power supplies to said first and second electrodes with a time lag between stopping said first RF power supply and stopping said second RF power supply, thereby ending conversion of the etching gas into the plasma.

10. A method according to claim 9, wherein the first and second RF powers are decreased stepwise so that application of the first RF power and application of the second RF power are stopped with the time lag therebetween.

11. A method of etching a target object in a plasma etching apparatus having a hermetic chamber, a first electrode for supporting the target object in said chamber, a second electrode opposing said first electrode in said chamber, and first and second RF power supplies for independently applying first and second RF power to said first and second electrodes, said method comprising the steps of:

selecting parameters including frequencies, power values, and relative phases of the first and second RF power supplies in order to set at least one etching characteristic, selected from a group consisting of an etching rate, a planar uniformity of the etching rate, and an etching selectivity ratio, to a predetermined value;

setting said plasma etching apparatus in accordance with the selected parameters;

causing said first electrode to support the target object;

setting said chamber in a reduced-pressure state;

introducing an etching gas into said chamber;

starting application of power from the first and second RF power supplies to said first and second electrodes with a time lag between starting said first RF power supply and starting said second RF power supply, thereby starting conversion of the etching gas into a plasma;

continuing application of the power from the first and second RF power supplies to said first and second electrodes, thereby continuing conversion of the etching gas into the plasma;

etching the target object by using the plasma; and stopping application of power from the first and second RF power supplies to said first and second electrodes, thereby ending conversion of the etching gas into the plasma.

12. A method according to claim 1, wherein the first and second RF powers are increased stepwise so that application of the first RF power and application of the second RF power are started with the time lag therebetween.

* * * * *